US010490952B2

(12) United States Patent
Briant et al.

(10) Patent No.: US 10,490,952 B2
(45) Date of Patent: Nov. 26, 2019

(54) RECEPTACLE CAGE MEMBER HAVING LOCATING FEATURES

(71) Applicant: TE CONNECTIVITY CORPORATION, Berwyn, PA (US)

(72) Inventors: Eric David Briant, Dillsburg, PA (US); Randall Robert Henry, Lebanon, PA (US); Brandon Michael Matthews, McAlisterville, PA (US); James Charles Shiffler, Hershey, PA (US); Charles Jameson Valentine, Lancaster, PA (US); Leo Joseph Graham, Hershey, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/406,881

(22) Filed: Jan. 16, 2017

(65) Prior Publication Data

US 2018/0205184 A1   Jul. 19, 2018

(51) Int. Cl.
| | |
|---|---|
| *H05K 5/00* | (2006.01) |
| *H01R 13/6594* | (2011.01) |
| *H01R 12/70* | (2011.01) |
| *H01R 12/58* | (2011.01) |
| *H01R 13/518* | (2006.01) |

(52) U.S. Cl.
CPC ......... *H01R 13/6594* (2013.01); *H01R 12/58* (2013.01); *H01R 12/7005* (2013.01); *H01R 13/518* (2013.01); *H05K 5/00* (2013.01)

(58) Field of Classification Search
None
See application file for complete search history.

(56) References Cited

U.S. PATENT DOCUMENTS

| | | | | |
|---|---|---|---|---|
| 5,254,010 A * | 10/1993 | Davis | ................... | H01R 13/658 |
| | | | | 439/108 |
| 7,070,446 B2 * | 7/2006 | Henry | ................ | H01R 23/6873 |
| | | | | 439/541.5 |
| 8,223,498 B2 * | 7/2012 | Lima | .................. | H05K 7/20418 |
| | | | | 361/704 |
| 8,545,268 B2 * | 10/2013 | Fogg | .................. | H01R 13/6587 |
| | | | | 439/607.25 |
| 9,287,640 B2 * | 3/2016 | Hirschy | ............... | H01R 12/585 |
| 2004/0027816 A1 * | 2/2004 | Ice | ....................... | G02B 6/4201 |
| | | | | 361/797 |

(Continued)

*Primary Examiner* — Courtney L Smith
*Assistant Examiner* — Rashen E Morrison

(57) ABSTRACT

A connector assembly includes a cage member having a plurality of walls defining a module cavity for a pluggable module. The walls include a top wall, a bottom wall and side walls extending between the top and bottom walls. The side walls extend to a bottom edge at the bottom wall and include mounting pins extending from the bottom edge that each have a press-fit portion configured to be press fit in a plated via of a circuit board. The bottom wall has a generally planar bottom surface facing the circuit board and a generally planar top surface facing the module cavity. The bottom wall includes a locating feature extending below the bottom surface and having a datum surface configured to engage the circuit board. The datum surface is a predetermined distance from the top surface to set a position of the top surface relative to the circuit board.

20 Claims, 4 Drawing Sheets

(56) References Cited

U.S. PATENT DOCUMENTS

| | | | |
|---|---|---|---|
| 2011/0294347 A1* | 12/2011 | Lang | H01R 9/038 |
| | | | 439/607.01 |
| 2014/0199862 A1* | 7/2014 | Hirschy | H01R 12/585 |
| | | | 439/84 |
| 2016/0211623 A1* | 7/2016 | Sharf | H01R 13/665 |

* cited by examiner

RECEPTACLE CAGE MEMBER HAVING LOCATING FEATURES

BACKGROUND OF THE INVENTION

The subject matter described herein relates to receptacle cage members for pluggable modules having locating features.

At least some known communication systems include receptacle connector assemblies, such as input/output (I/O) connector assemblies, that are configured to receive a pluggable module and establish a communicative connection between the pluggable module and a communication connector of the receptacle connector assembly. As one example, a known receptacle connector assembly includes a cage member that is mounted to a circuit board and configured to receive a small form-factor (SFP) pluggable transceiver. The receptacle connector assembly includes an elongated cavity that extends between an opening of the cavity and an electrical connector that is disposed within the cavity and mounted to the circuit board. The pluggable module is inserted through the opening and advanced toward the communication connector in the cavity. The bottom wall of the cage member is used to guide the pluggable module along the module cavity to the communication connector, and thus needs to be properly positioned relative to the circuit board and the communication connector to ensure proper mating of the pluggable module with the communication connector.

One challenge often encountered in the design of the pluggable module and receptacle connector assembly is the containment and management of electromagnetic interference (EMI), which negatively affects module/system electrical performance. The walls of the cage member are typically stamped and formed walls having features stamped therein. Openings are formed from the stamping process. The openings define EMI leakage areas. Some openings in the cage walls are too large to effectively manage EMI containment, particularly at high frequency operation. For instance, press-fit pins formed in the cage walls have large openings associated therewith, either from the pins being stamped out of the walls or the walls having clearance slots to allow the pins to pass through the wall. The clearance slots are usually long enough to receive the pins and standoff portions defined along the pins that are used to position the cage member relative to the circuit board. The standoffs are defined by shoulders formed along the pins that are wider than the compliant portions of the press-fit pins. The standoffs pass through the slots in the wall, such as the bottom wall, to engage the circuit board. The slots are oversized to receive the standoffs, causing an EMI leakage area in the bottom wall.

Accordingly, there is a need for a cage member having improved EMI shielding for the pluggable modules of the communication system.

BRIEF DESCRIPTION OF THE INVENTION

In an embodiment, a connector assembly is provided including a cage member configured to be mounted to a circuit board. The cage member has a plurality of walls defining at least one module cavity configured to receive a corresponding pluggable module therein. The walls include a top wall, a bottom wall and side walls extending between the top and bottom walls. The walls are manufactured from a metal material and providing electrical shielding. The side walls extend to a bottom edge at the bottom wall and include mounting pins extending from the bottom edge. The mounting pins each have a press-fit portion configured to be press fit in a plated via of the circuit board. The bottom wall has a generally planar bottom surface facing the circuit board and a generally planar top surface facing the at least one module cavity. The bottom wall includes at least one locating feature extending below the bottom surface. The locating feature has a datum surface configured to engage the circuit board. The datum surface is a predetermined distance from the top surface to set a position of the top surface relative to the circuit board.

In another embodiment, a connector assembly is provided including a cage member configured to be mounted to a circuit board. The cage member has a plurality of walls defining at least one module cavity configured to receive a corresponding pluggable module therein. The walls include a top wall, a bottom wall and side walls extending between the top and bottom walls. The walls are manufactured from a metal material and providing electrical shielding. The side walls extend to a bottom edge at the bottom wall and include mounting pins extending from the bottom edge. The mounting pins each having a press-fit portion configured to be press fit in a plated via of the circuit board. The press-fit portion has a maximum length defined between opposite outer edges of the press-fit portion. The bottom wall includes pin slots therein receiving corresponding mounting pins. The pin slots have pin slot lengths approximately equal to the maximum lengths to allow the press-fit portions of the mounting pins to pass therethrough without plastic deformation of the press-fit portions. The bottom wall has a generally planar bottom surface facing the circuit board and a generally planar top surface facing the at least one module cavity. The bottom wall includes at least one locating feature extending below the bottom surface configured to engage the circuit board to position the bottom wall relative to the circuit board.

In a further embodiment, a communication system is provided including a pluggable module having a pluggable body extending between a mating end and a cable end and having a top and an opposite bottom with sides extending therebetween along a length of the pluggable body with an internal circuit board held in the pluggable body. The communication system includes a connector assembly having a communication connector and a cage member configured to be mounted to a circuit board. The cage member has a plurality of walls being manufactured from a metal material and providing electrical shielding. The plurality of walls of the cage member define at least one module cavity configured to receive the pluggable module therein. The communication connector is positioned in the module cavity for mating with the pluggable module. The walls include a top wall, a bottom wall and side walls extending between the top and bottom walls. The side walls extend to a bottom edge at the bottom wall and include mounting pins extending from the bottom edge. The mounting pins each have a press-fit portion configured to be press fit in a plated via of the circuit board. The bottom wall has a generally planar bottom surface facing the circuit board and a generally planar top surface facing the module cavity. The top surface supports the pluggable module and guides the pluggable module as the pluggable module is loaded into the module cavity. The bottom wall includes at least one locating feature extending below the bottom surface. The locating feature is configured to engage the circuit board to set a position of the top surface relative to the circuit board to guide mating of the pluggable module with the communication connector.

DETAILED DESCRIPTION OF THE INVENTION

Figure 1:
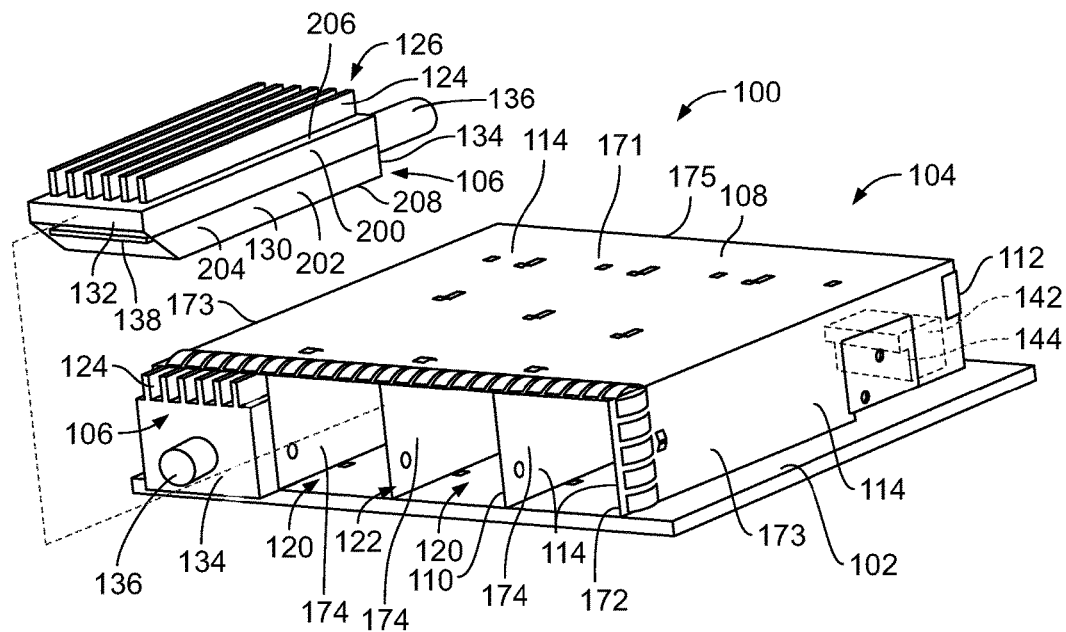
FIG. 1 is a front perspective view of a communication system including a connector assembly in accordance with an embodiment.

FIG. 1 is a front perspective view of a communication system 100 in accordance with an embodiment. The communication system 100 includes a circuit board 102, a receptacle connector assembly 104 mounted to the circuit board 102, and one or more pluggable modules 106 that are configured to communicatively engage the connector assembly 104 (one pluggable module 106 is shown mated to the connector assembly 104 and another pluggable module 106 is shown poised for mating with the connector assembly 104). The connector assembly 104 is illustrated as a multiport assembly configured to receive multiple pluggable modules 106. The connector assembly 104 may have stacked and/or ganged ports.

The pluggable module 106 is an input/output (I/O) module configured to be inserted into and removed from the connector assembly 104. In some embodiments, the pluggable module 106 is a small form-factor pluggable (SFP) transceiver or quad small form-factor pluggable (QSFP) transceiver or a MicroQSFP transceiver. The pluggable module 106 may satisfy certain technical specifications for SFP, QSFP or MicroQSFP transceivers, such as Small-Form Factor (SFF)-8431. In some embodiments, the pluggable module 106 is configured to transmit data signals up to 2.5 gigabits per second (Gbps), up to 5.0 Gbps, up to 10.0 Gbps, up to 28 Gbps, or more.

The communication system 100 may be part of or used with telecommunication systems or devices. For example, the communication system 100 may be part of or include a switch, router, server, hub, network interface card, or storage system. In the illustrated embodiment, the pluggable module 106 is configured to transmit data signals in the form of electrical signals. In other embodiments, the pluggable module 106 may be configured to transmit data signals in the form of optical signals. The circuit board 102 may be a daughter card or a mother board and include conductive traces (not shown) extending therethrough.

The connector assembly 104 includes a cage member 108 that is mounted to the circuit board 102. The cage member 108 may be arranged at a bezel or faceplate of a chassis of the system or device, such as through an opening in the faceplate. As such, the cage member 108 is interior of the device and corresponding faceplate and the pluggable modules 106 are loaded into the cage member 108 from outside or exterior of the device and corresponding faceplate.

The cage member 108 includes a front end 110 and an opposite rear end 112. The front end 110 may be provided at, and extend through an opening in, the faceplate. Relative or spatial terms such as "front," "back," "top," or "bottom" are only used to distinguish the referenced elements and do not necessarily require particular positions or orientations in the communication system 100 or in the surrounding environment of the communication system 100. For example, the front end 110 may be located in or facing a back portion of a larger telecommunication system. In many applications, the front end 110 is viewable to a user when the user is inserting the pluggable module 106 into the connector assembly 104.

The cage member 108 is configured to contain or block electromagnetic interference (EMI) and guide the pluggable modules 106 during a mating operation. To this end, the cage member 108 includes a plurality of walls 114 that are interconnected with one another to form the cage member 108. The walls 114 may be formed from a conductive material, such as sheet metal and/or a polymer having conductive particles. In the illustrated embodiment, the walls 114 are stamped and formed from sheet metal. In some embodiments, the cage member 108 is configured to facilitate airflow through the cage member 108 to transfer heat (or thermal energy) away from the connector assembly 104 and pluggable module(s) 106. The air may flow from inside the cage member 108 (for example, behind the faceplate) to the external environment (for example, forward of the faceplate) or from outside the cage member 108 into the interior of the cage member 108. Fans or other air moving devices may be used to increase airflow through the cage member 108 and over the pluggable module(s) 106.

In the illustrated embodiment, the cage member 108 includes a plurality of module cavities 120. The cage member 108 may include any number of module cavities 120, which may be stacked vertically and/or stacked horizontally. The module cavities 120 extend between the front and rear ends 110, 112. The module cavities 120 each have a port opening 122 that is sized and shaped to receive the corresponding pluggable module 106. The module cavity 120 extends lengthwise in a direction that is parallel to a mating axis with the pluggable module 106. In an exemplary embodiment, loading of the pluggable module 106 into the module cavity 120 is guided by one or more of the walls 114.

In some embodiments, the pluggable module 106 is an input/output cable assembly having a pluggable body 130. The pluggable body 130 includes a mating end 132 and an opposite cable end 134. A cable 136 is coupled to the pluggable body 130 at the cable end 134. The pluggable body 130 also includes an internal circuit board 138 that is communicatively coupled to electrical wires or optical fibers (not shown) of the cable 136. The cable 136 may be communicatively coupled by directly terminating the wires to the internal circuit board 138, such as by soldering the wires to the internal circuit board. Alternatively, the cable 136 may be communicatively coupled by other processes, such as by using connectors at the end of the cable 136 and on the internal circuit board 138. The internal circuit board 138 is supported by the pluggable body 130. The mating end 132 is configured to be inserted into the module cavity 120 of the cage member 108 and advanced in a mating direction along a mating axis. The walls 114 of the cage member 108 guide the pluggable module 106 during loading of the pluggable module 106 into the module cavity 120.

In an exemplary embodiment, the pluggable body 130 provides heat transfer for the internal circuit board 138, such as for the electronic components on the internal circuit board 138. For example, the internal circuit board 138 is in thermal communication with the pluggable body 130 and the pluggable body 130 transfers heat from the internal circuit board 138. In an exemplary embodiment, the pluggable body 130 includes a plurality of heat transfer fins 124 along at least a portion of the outer perimeter of the pluggable module 106. For example, in the illustrated embodiment, the fins 124 are provided along the top; however the fins 124 may additionally or alternatively be provided along the sides and/or the bottom. The fins 124 transfer heat away from the main shell of the pluggable body 130, and thus from the internal circuit board 138 and associated components. The fins 124 are separated by gaps 126 that allow airflow or other cooling flow along the surfaces of the fins 124 to dissipate the heat therefrom.

The connector assembly 104 includes communication connectors 142 having corresponding mating interfaces 144 (both shown in phantom) configured to mate with the pluggable modules 106. The communication connectors 142 and mating interfaces 144 are disposed within corresponding module cavities 120. The mating interfaces 144 are generally aligned with the port openings 122 and positioned near the rear end 112. The walls 114 of the cage member 108 guide mating of the pluggable module 106 with the communication connector 142, such as by aligning the internal circuit board 138 with the mating interface 144. Each mating interface 144 includes electrical contacts, such as spring beams that are configured to directly engage the contact pads of the internal circuit board 138 of the pluggable module 106.

The communication connectors 142 are configured to be mounted to the circuit board 102. The communication connectors 142 are received in the cage member 108 through the bottom. For example, the cage member 108 is configured to be mounted to the circuit board 102 over the communication connectors 142 such that the communication connectors 142 pass through an opening(s) in the bottom as the cage member 108 is mounted to the circuit board 102. The cage member 108 is independently located relative to the communication connectors 142 to ensure proper mating of the pluggable modules 106 with the communication connectors 142. For example, the vertical position of the cage member 108 is controlled to vertically align the internal circuit board 138 of the pluggable module 106 with the corresponding communication connector 142.

In some embodiments, the cage member 108 is formed from a plurality of interconnected panels or sheets, which define the walls 114. For example, the cage member 108 includes a top wall 171, a bottom wall 172, outer side walls 173, inner side walls 174 and a rear wall 175 at the rear end 112. The side walls 173, 174 extend between the top and bottom walls 171, 172. In the illustrated embodiment, the top and bottom walls 171, 172 are oriented horizontally (for example, parallel to the circuit board 102) and the side walls 173, 174 are oriented vertically (for example, perpendicular to the circuit board 102). The top wall 171, the bottom wall 172, the outer side walls 173 and the rear wall 175 define exterior walls of the cage member 108. The inner side walls 174 are interior walls that are used to separate the module cavities 120. For example, module cavities 120 are provided on both sides of the separator walls 174. The inner side walls 174 thus define separator walls and may be referred to hereinafter as separator walls 174. Other inner side walls oriented horizontally may be provided that separate upper module cavities from lower module cavities. The cage member 108 may include a front wall at the front end 110 or other walls.

The panels or sheets forming the walls 114 may be stamped and formed from sheet metal. The bottom wall 172 is configured to be supported by the circuit board 102. In an exemplary embodiment, the bottom wall 172 includes one or more locating features 176 (shown in FIG. 2) that are used to position the bottom wall 172 relative to the circuit board 102. For example, the locating features 176 hold the bottom wall 172 spaced apart from the circuit board 102 at a predetermined height to control the position of the pluggable module 106 relative to the circuit board 102 for mating with the communication connector 142.

In an exemplary embodiment, the bottom wall 172 includes one or more communication connector openings 178 (shown in FIG. 2) therethrough that receive the communication connectors 142 extending from the circuit board 102. The cage member 108 may be mounted onto the circuit board 102 over the communication connectors 142 such that the communication connectors 142 are loaded into the module cavity 120. When the cage member 108 is mounted to the circuit board 102, the cage member 108 is electrically coupled to the circuit board 102 and, in particular, to ground planes (not shown) within the circuit board 102 to electrically ground the cage member 108. As such, the connector assembly 104 may reduce EMI that may negatively affect electrical performance of the communication system 100.

In an exemplary embodiment, the connector assembly 104 includes one or more EMI skirts 180 (shown in FIG. 3) which are positioned in each of the module cavities 120 near the communication connectors 142. The EMI skirt 180 is interior of the cage walls 114 and faces the interior of the module cavity 120, such as the corresponding pluggable module 106 in the module cavity 120. The EMI skirt 180 is electrically connected to the walls 114 surrounding the associated module cavity 120. The EMI skirt is configured to directly engage the pluggable module 106 to electrically connect to the pluggable body 130 of the pluggable module 106 to create electrical continuity between the pluggable module 106 and the cage member 108. The EMI skirt 180 may reduce EMI leakage from the cage member 108, from the communication connector 142 and/or from the pluggable module 106. Optionally, the EMI skirt 180 may include discrete members that surround different portions of the pluggable module 106 and module cavity 120.

The pluggable body 130 defines a shell around the internal circuit board 138. Optionally, the pluggable body 130 may be defined by first and second shells 200, 202 that are joined together above and below the internal circuit board 138. The first and second shells 200, 202 meet along sides 204 of the pluggable body 130. The first shell 200 defines an upper end or top 206 of the pluggable body 130 and the second shell 202 defines a lower end or bottom 208 of the pluggable body 130. The bottom 208 may rest on the bottom wall 172 as the pluggable module 106 is loaded into the module cavity 120 to guide mating of the pluggable module 106 with the communication connector 142. The position of the bottom wall 172 thus controls the position of the pluggable module 106 for alignment with the communication connector 142.

Figure 2:
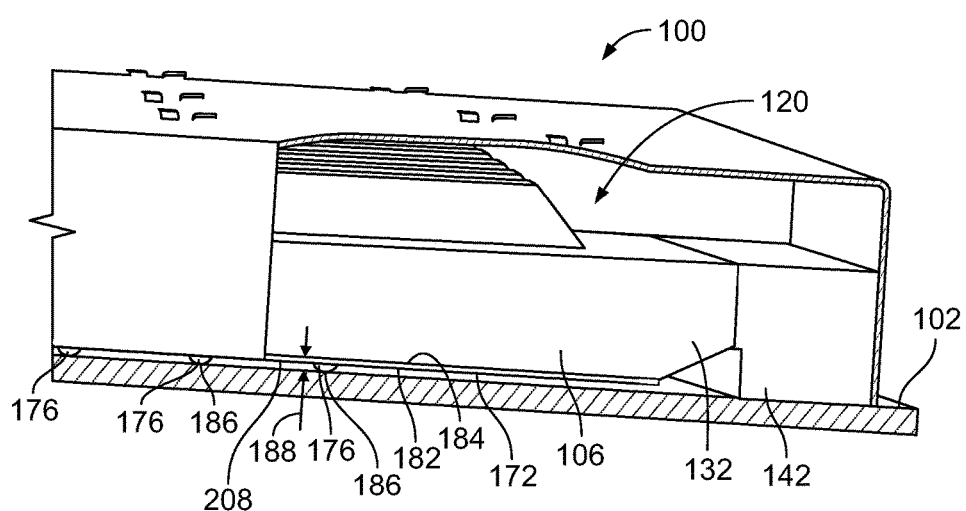
FIG. 2 is a partial sectional view of a portion of the communication system showing a pluggable module mated with a communication connector of the connector assembly.

FIG. 2 is a partial sectional view of a portion of the communication system 100 showing the pluggable module 106 mated with the communication connector 142. The pluggable module 106 is supported by the bottom wall 172.

The bottom wall 172 has a generally planar bottom surface 182 facing the circuit board 102 and a generally planar top surface 184 facing the module cavity 120. The bottom 208 of the pluggable module 106 is supported by the top surface 184 and the top surface 184 is used to guide loading of the pluggable module 106 in the module cavity 120 during mating with the communication connector 142. The bottom wall 172 includes the locating features 176 extending below the bottom surface 182. The locating features 176 have datum surfaces 186 configured to engage the circuit board 102. The datum surfaces 186 are a predetermined distance 188 from the top surface 184 to set a position of the top surface 184, and thus the pluggable module 106, relative to the circuit board 102, such as to align the mating end 132 of the pluggable module 106 with the communication connector 142.

Figure 3:
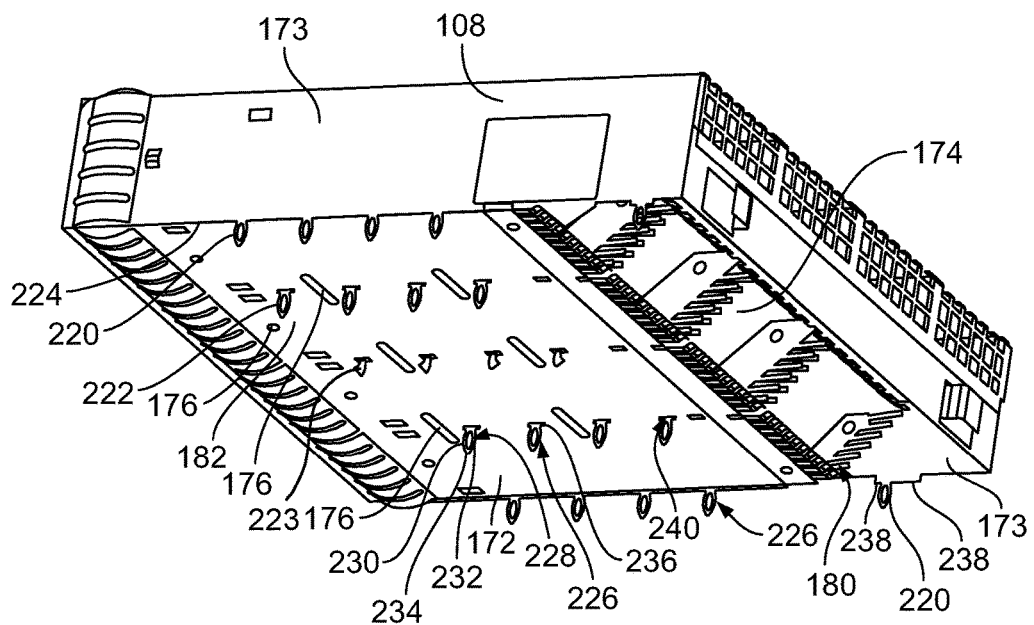
FIG. 3 is a bottom perspective view of a cage member of the connector assembly in accordance with an exemplary embodiment.

FIG. 3 is a bottom perspective view of the cage member 108 in accordance with an exemplary embodiment. FIG. 3 shows the locating features 176 extending from the bottom surface 182. Any number of locating features 176 may be provided. The locating features 176 may be provided at any suitable location along the bottom surface 182 for supporting the bottom wall 172 of the cage member 108. In the illustrated embodiment, the locating features 176 are elongated ribs, which may be generally aligned below each of the separator walls 174. When the cage member 108 is pressed downward onto the circuit board 102 (shown in FIG. 1), the pressing forces may be transferred through the separator walls 174 to the locating features 176 to press the locating features 176 against the circuit board 102.

Optionally, the locating features 176 may be integrally formed with the bottom wall 172. For example, the locating features 176 may be formed out of the bottom wall 172 such as by a coining process. In alternative embodiments, the locating features 176 may be discrete from the bottom wall 172 and coupled thereto, such as by welding or using adhesive. In an exemplary embodiment, the bottom wall 172 does not include any openings or EMI leakage paths in the bottom wall 172 around the locating features 176. Rather, the bottom wall 172 is continuous and uninterrupted around the locating features 176.

In an exemplary embodiment, the outer and inner side walls 173, 174 include outer and inner mounting pins 220, 222, respectively, extending from bottom edges 224 of the outer and inner side walls 173, 174. In some instances, any combination of the outer mounting pins 220 and/or the inner mounting pins 222 may be referred to simply as "mounting pins". The outer and inner mounting pins 220, 222 each have a press-fit portion 226 configured to be press-fit in a corresponding plated via of the circuit board 102. In the illustrated embodiment, the press-fit portions 226 are compliant eye-of-the-needle pins. For example, the press-fit portions 226 include an opening 228 surrounded by first and second legs 230, 232 on opposite sides of the opening 228. The legs 230, 232 are bowed outward away from each other. When the press-fit portion 226 is press-fit in the plated via, the legs 230, 232 are deflected inward to at least partially close the opening 228. The legs 230, 232 spring outward against the plated via to electrically connect the outer and inner mounting pins 220, 222 to the circuit board 102.

The press-fit portion 226 extends to a tip 234. The outer and inner mounting pins 220, 222 have a stem 236 extending between the press-fit portion 226 and the bottom edge 224. The outer and inner mounting pins 220, 222 are integral with the corresponding sidewalls 173, 174. For example, the outer and inner mounting pins 220, 222 may be stamped and formed with the corresponding sidewalls 173, 174. The outer and inner mounting pins 220, 222 provide an electrical connection between the circuit board 102 and the cage member 108. Other types of mounting pins may be provided in alternative embodiments. For example, in the illustrated embodiment, at least some of the inner mounting pins 222 are non-compliant pins. More particularly, a middle row of the inner mounting pins 222 are hook pins 223 configured to engage the circuit board 102. Other types of mounting pins may be provided in alternative embodiments. Optionally, at least some of the outer mounting pins 220 may include shoulders 238 that are used to locate the mounting depth of the outer mounting pins 220 into the circuit board 102. For example, the shoulders 238 are wider than the press-fit portions 226 and may seat against the top surface of the circuit board 102 during assembly to control the depth that the outer mounting pins 220 are loaded into the vias in the circuit board 102. Optionally, the bottom edges 224 of the outer side walls 173 may define the shoulders 238. In an exemplary embodiment, the inner mounting pins 222 do not include any shoulders and are thus narrower than the outer mounting pins 220 with the shoulders 238.

The inner mounting pins 222 extending from the separator walls 174 pass through the bottom wall 172 to interface with the circuit board 102. The bottom wall 172 includes pin slots 240 that receive the inner mounting pins 222. In an exemplary embodiment, the pin slots 240 are small to prevent EMI leakage therethrough. Optionally, the pin slots 240 may be less than 2.0 mm to provide EMI containment at high frequencies, such as 25 GHz or higher. Optionally, the outer mounting pins 220 extending from the outer side walls 173 may pass through corresponding pin slots 240 and the bottom wall 172. Alternatively, as in the illustrated embodiment, the outer mounting pins 220 extending from the outer side walls 173 are provided at the outer edges of the bottom wall 172 such that the outer mounting pins 220 do not need to pass through the bottom wall 172. As such, the bottom wall 172 does not need corresponding pin slots 240 for the outer mounting pins 220.

Figure 4:
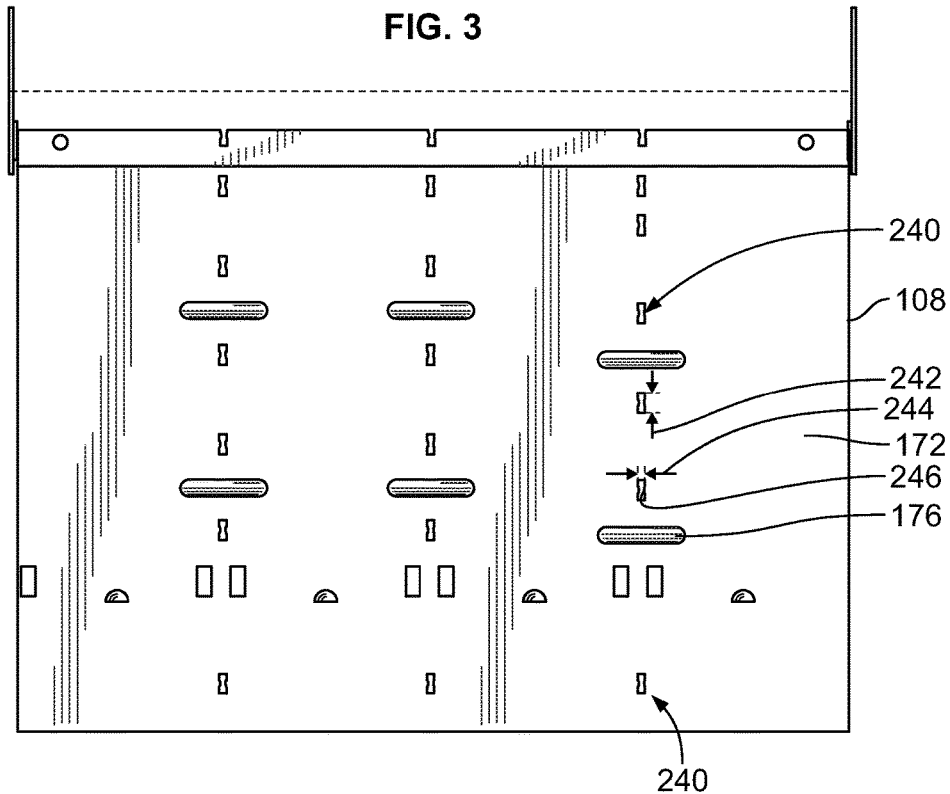
FIG. 4 is a bottom view of the cage member showing a bottom wall thereof.
Figure 5:
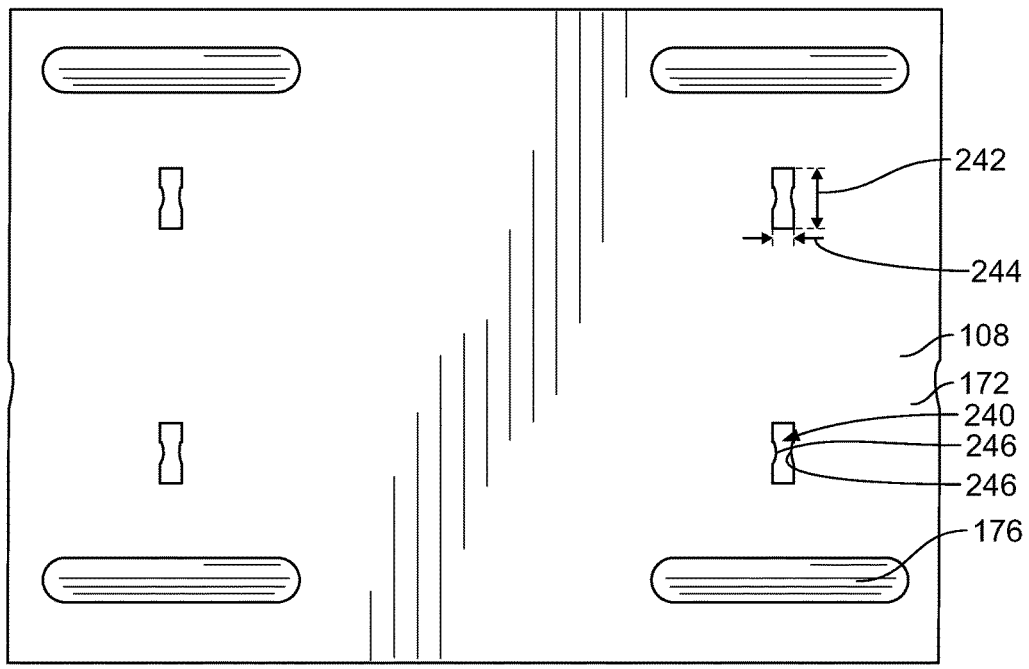
FIG. 5 is a bottom view of a portion of the cage member showing the bottom wall.
Figure 6:
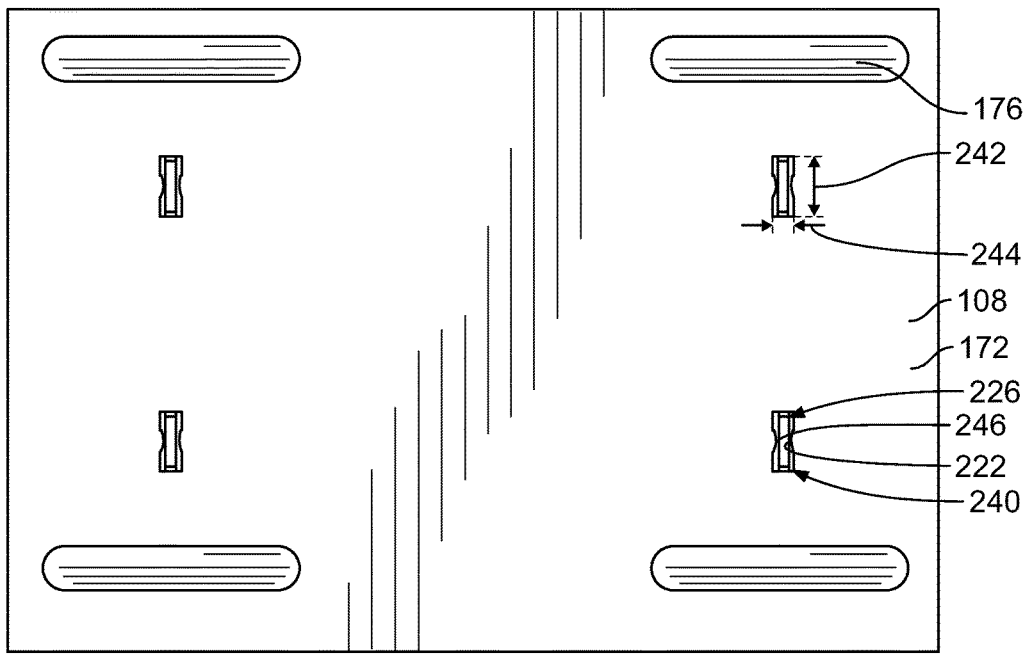
FIG. 6 is a bottom view of a portion of the cage member showing mounting pins coupled to the bottom wall.

FIG. 4 is a bottom view of the cage member 108 showing the bottom wall 172. FIG. 5 is a bottom view of a portion of the cage member 108 showing the bottom wall 172. FIG. 6 is a bottom view of a portion of the cage member 108 showing the inner mounting pins 222 in corresponding pin slots 240. The locating features 176 are shown in line with the pin slots 240. Each pin slot 240 has a pin slot length 242 and a pin slot width 244. The pin slot length 242 and the pin slot width 244 are selected to correspond to a length and a width, respectively, of the inner mounting pins 222 (FIG. 6) to minimize a gap around the inner mounting pins 222 when received in the pin slot 240 for EMI containment.

Optionally, the pin slot length 242 may be approximately equal to a length of the press-fit portion 226 (FIG. 6) to allow the press-fit portion 226 to pass through the pin slot 240 without plastic deformation of the press-fit portion 226. Optionally, the pin slot length 242 may be slightly less than the length of the press-fit portion 226 such that the press-fit portion 226 is squeezed through the pin slot 240 during assembly.

Optionally, the pin slot width 244 may be approximately equal to a width of the inner mounting pins 222. In an exemplary embodiment, the pin slot width 244 is variable along the length of the pin slot 240. For example, the bottom wall 172 defines pinch points 246 extending into the pin slot 240. The pin slot 240 may have an hourglass shape with the pinch points 246 approximately centered along the pin slot length 242. The pinch points 246 may extend inward from one side or both sides of the pin slot 240, as in the illustrated embodiment. The pinch points 246 are configured to directly engage the inner mounting pins 222 when received in the pin slot 240 to create an electrical connection between the bottom wall 172 and the inner mounting pins 222, which may reduce the effective lengths of the openings surrounding the inner mounting pins 222.

Figure 7:
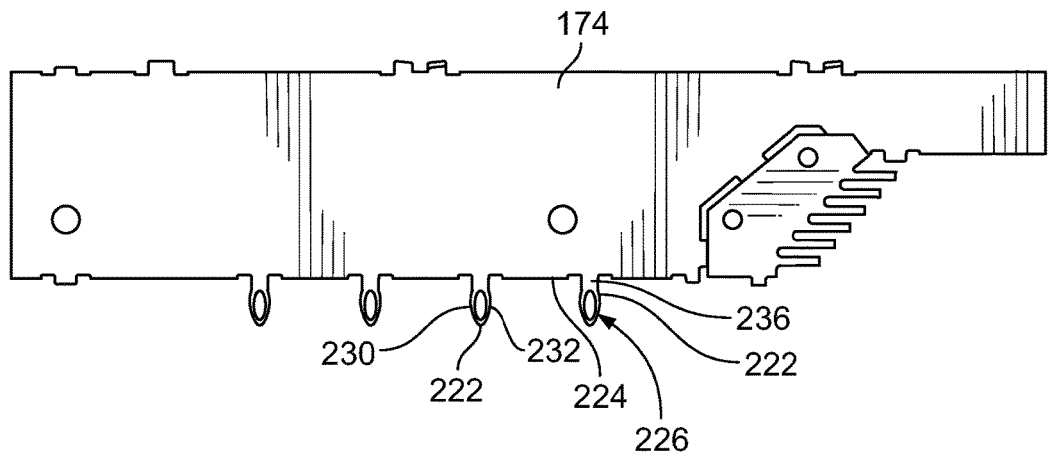
FIG. 7 is a side view of a separator wall of the cage member showing the mounting pins.
Figure 8:
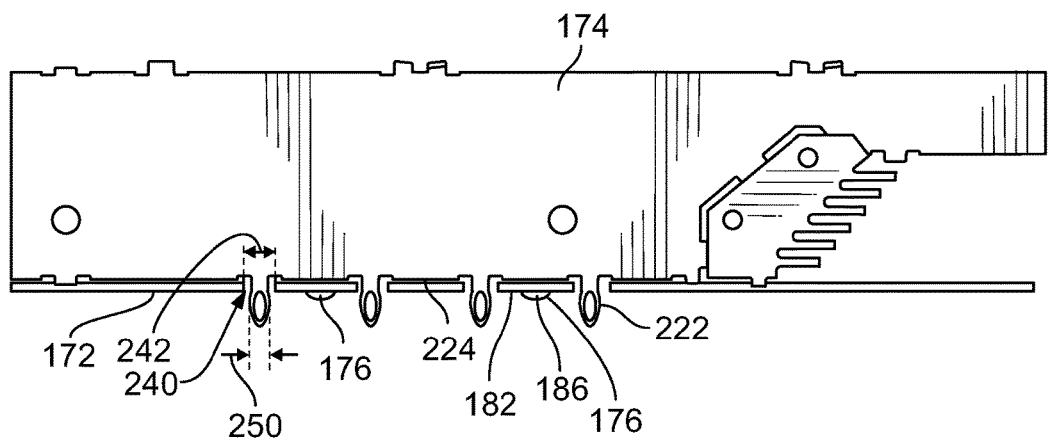
FIG. 8 is a side view of the separator wall mounted to the bottom wall.

FIG. 7 is a side view of one of the separator walls 174 showing the inner mounting pins 222 extending from the bottom edge 224. FIG. 8 is a side view of the separator wall 174 mounted to the bottom wall 172. Each inner mounting pin 222 includes the stem 236 extending from the bottom edge 224 to the press-fit portion 226. In an exemplary embodiment, the inner mounting pin 222 is devoid of any shoulder above the press-fit portion 226. For example, the stem 236 does not include any wider portions defined by one or more shoulders. No portion of the stem 236 is wider than the press-fit portion 226.

The press-fit portion 226 has a maximum length 250 defined at the widest part between the outer edges of the first and second legs 230, 232. The maximum length 250 is the widest portion of the mounting pin 222. As such, the pin slots 240 (FIG. 8) receiving the inner mounting pins 222 do not need to be elongated to accommodate shoulders of the inner mounting pins 222. Rather, the pin slot length 242 may be selected based on the maximum length 250. The pin slot length 242 may be approximately equal to the maximum length 250. Optionally, the pin slot length 242 may be slightly less than the maximum length 250 to generally make the pin slot 240 as small as possible without negatively impacting the press-fit portion 226. For example, the press-fit portion 226 does not undergo plastic deformation when passing through the pin slot 240. While gaps 252 exist between the bottom wall 172 and the stem 236 of the inner mounting pin 222, the gaps 252 are small to provide effective EMI containment, such as at high frequencies.

The locating features 176 extend below the bottom surface 182 of the bottom wall 172. The datum surfaces 186 are configured to engage the circuit board 102 (shown in FIG. 1) to locate the cage member 108 relative to the circuit board 102. Providing the locating features 176 separate from the inner mounting pins 222 eliminates the need for locating shoulders on the inner mounting pins 222, which are prevalent in conventional cage members. Eliminating the shoulders on the inner mounting pins 222, as noted above, allows for reduced pin slot lengths 242 and improved EMI containment.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A connector assembly comprising: a cage member configured to be mounted to a circuit board, the cage member having a plurality of walls defining at least one module cavity configured to receive a corresponding pluggable module therein, the plurality of walls including a horizontal top wall, a horizontal bottom wall and vertical side walls extending between the top wall and the bottom wall, the top wall, the bottom wall and the side walls being exterior walls of the cage member, the plurality of walls being manufactured from a metal material and providing electrical shielding; wherein the side walls extend to a bottom edge at the bottom wall and include mounting pins extending from the bottom edge, the mounting pins each having a press-fit portion configured to be press-fit in a corresponding plated via of the circuit board; and wherein the bottom wall extends between the side walls, the bottom wall having a generally planar bottom surface facing the circuit board and the bottom wall has a generally planar top surface located below the at least one module cavity and facing the at least one module cavity, the bottom wall includes at least one locating feature extending below the bottom surface, the locating feature of the bottom wall having a datum surface configured to engage the circuit board, the datum surface being a predetermined distance from the top surface, the datum surface of the locating feature of the bottom wall setting a position of the top surface relative to the circuit board at the predetermined distance.

2. The connector assembly of claim 1, wherein the top surface defines a guide surface for supporting and guiding the pluggable module into the module cavity.

3. The connector assembly of claim 1, wherein the locating feature holds the bottom surface spaced apart from the circuit board.

4. The connector assembly of claim 1, wherein the locating feature is formed from and integral with the bottom wall.

5. The connector assembly of claim 1, wherein the locating feature is discrete from the bottom wall and coupled thereto.

6. The connector assembly of claim 1, wherein the bottom wall does not include any openings in the bottom wall around the locating feature.

7. The connector assembly of claim 1, wherein the locating feature is a rib defining a standoff to support the bottom wall spaced apart from the circuit board.

8. The connector assembly of claim 1, wherein the bottom wall includes pin slots receiving corresponding mounting pins, the pin slots having pin slot lengths approximately equal to maximum lengths of the press-fit portions to allow the press-fit portions to pass therethrough without plastic deformation of the press-fit portions.

9. The connector assembly of claim 8, wherein the pin slots have pinch points formed into the pin slots, the pinch points engaging the mounting pins.

10. The connector assembly of claim 1, wherein the press-fit portion is the only portion of the mounting pin configured to engage the circuit board.

11. The connector assembly of claim 1, wherein the mounting pin is devoid of a shoulder.

12. The connector assembly of claim 1, wherein the press-fit portion is the widest portion of the mounting pin.

13. A connector assembly comprising: a cage member configured to be mounted to a circuit board, the cage member having a plurality of walls defining at least one module cavity configured to receive a corresponding pluggable module therein, the plurality of walls including a horizontal top wall, a horizontal bottom wall and vertical side walls extending between the top wall and the bottom wall, the top wall, the bottom wall and the side walls being exterior walls of the cage member, the plurality of walls being manufactured from a metal material and providing electrical shielding; wherein the side walls extend to a bottom edge at the bottom wall and include mounting pins extending from the bottom edge, the mounting pins each having a press-fit portion configured to be press-fit in a corresponding plated via of the circuit board, the press-fit portion having a maximum length defined between opposite outer edges of the press-fit portion; wherein the bottom wall includes pin slots therein receiving corresponding mounting pins, the pin slots having pin slot lengths approximately equal to the maximum lengths to allow the press-fit portions of the mounting pins to pass through the pin slots without plastic deformation of the press-fit portions; and wherein the bottom wall extends between the side walls, the bottom wall having a generally planar bottom surface facing the circuit board and the bottom wall has a generally planar top surface below the at least one module cavity and facing the at least one module cavity, the bottom wall includes at least one locating feature extending below the bottom surface and configured to engage the circuit board, the locating feature of the bottom wall setting a position of the bottom wall relative to the circuit board according to a predetermined distance.

14. The connector assembly of claim 13, wherein the bottom wall defines pinch points extending into the pin slots, the pinch points engaging the mounting pins.

15. The connector assembly of claim 13, wherein the top surface defines a guide surface for supporting and guiding the pluggable module into the module cavity.

16. The connector assembly of claim 13, wherein the locating feature holds the bottom surface spaced apart from the circuit board.

17. The connector assembly of claim 13, wherein the bottom wall does not include any openings in the bottom wall around the locating feature.

18. The connector assembly of claim 13, wherein the press-fit portion is the only portion of the mounting pin configured to engage the circuit board.

19. A communication system comprising: a pluggable module comprising a pluggable body extending between a mating end and a cable end, the pluggable body having a top and an opposite bottom with sides extending there between along a length of the pluggable body, the pluggable module having an internal circuit board held in the pluggable body; and a connector assembly comprising a communication connector and a cage member configured to be mounted to a circuit board, the cage member having a plurality of walls being manufactured from a metal material and providing electrical shielding, the plurality of walls of the cage member defining at least one module cavity configured to receive the pluggable module therein, the communication connector being positioned in the module cavity for mating with the pluggable module, the plurality of walls including a horizontal top wall, a horizontal bottom wall and vertical side walls extending between the top wall and the bottom wall, the top wall, the bottom wall and the side walls being exterior walls of the cage member, the side walls extend to a bottom edge at the bottom wall and include mounting pins extending from the bottom edge, the mounting pins each having a press-fit portion configured to be press-fit in a corresponding plated via of the circuit board, the bottom wall extends between the side walls, the bottom wall having a generally planar bottom surface facing the circuit board and the bottom wall has a generally planar top surface below the at least one module cavity and facing the module cavity, the top surface supporting the pluggable module and guiding the pluggable module as the pluggable module is loaded into the module cavity, the bottom wall includes at least one locating feature extending below the bottom surface, the locating feature configured to engage the circuit board, the locating feature of the bottom wall setting to set a position of the top surface relative to the circuit board according to a predetermined distance, to guide mating of the pluggable module with the communication connector.

20. The communication system of claim 19, wherein the locating feature holds the bottom surface spaced apart from the circuit board.

* * * * *